United States Patent

Pickup et al.

[11] Patent Number: 5,774,380
[45] Date of Patent: Jun. 30, 1998

[54] STATE CAPTURE/REUSE FOR VERILOG SIMULATION OF HIGH GATE COUNT ASIC

[75] Inventors: Lansing Dunn Pickup, Colchester; Paul Richard Schwartz, Williston; Todd William Westervelt, Colchester, all of Vt.

[73] Assignee: International Business Machines Corporation, Armonk, N.Y.

[21] Appl. No.: 613,275

[22] Filed: Mar. 8, 1996

[51] Int. Cl.⁶ .................................................. G06F 15/20
[52] U.S. Cl. .......................................... 364/578; 395/500
[58] Field of Search .................................. 364/488–491, 364/578; 395/500; 371/24

[56] References Cited

U.S. PATENT DOCUMENTS

| | | | |
|---|---|---|---|
| 5,146,460 | 9/1992 | Ackerman et al. | 371/23 |
| 5,274,574 | 12/1993 | Tsujido et al. | 364/551.02 |
| 5,327,361 | 7/1994 | Long et al. | 364/578 |
| 5,404,496 | 4/1995 | Burroughs et al. | 395/575 |
| 5,455,929 | 10/1995 | Bosshart et al. | 395/500 |
| 5,539,680 | 7/1996 | Palnitkar et al. | 364/578 |

FOREIGN PATENT DOCUMENTS

| | | | |
|---|---|---|---|
| 62-137664 | 6/1987 | Japan | G06F 15/56 |
| 3-99359 | 4/1991 | Japan | G06F 15/28 |

*Primary Examiner*—Kevin J. Teska
*Assistant Examiner*—A. S. Roberts
*Attorney, Agent, or Firm*—Whitham, Curtis, Whitham & McGinn; Richard Kotulak, Esq.

[57] ABSTRACT

A Verilog simulation method significantly reduces scenario execution time of very large scale integrated (VLSI) logic models that contain high numbers of sequential devices. A computer implemented method saves the state of sequential devices into a file at a chosen point in a simulation scenario and then inputs this file to initialize another simulation scenario. The method has the ability to utilize the user defined primitive (UDP) model data for the sequential devices present in the technology library. However, using the standard data structure available in the programming language interface (PLI), it is not possible to uniquely identify individual UDPs. UDPs have the characteristic of having only one output each. Therefore, it is possible to uniquely identify each UDP by the net name which is connected to this output. An exception to this is the situation where two or more like-named UDP outputs are connected to the same net. This is not considered a problem to this implementation, since the simulation execution will resolve the nets to one value (no checking is required).

4 Claims, 2 Drawing Sheets

STATE CAPTURE/REUSE FOR VERILOG SIMULATION OF HIGH GATE COUNT ASIC

BACKGROUND OF THE INVENTION

1. Field of the Invention

The present invention generally relates to the field of software for application program interfaces (APIs) used for design simulations of application specific integrated circuits (ASICs) and, more particularly, to a computer implemented method that allows designers to save or pre-assign states for all sequential devices at a chosen point in a Verilog simulation execution and allows this data to be used in other Verilog-based simulation scenarios.

2. Background Description

The invention is specifically directed to improvements in the use and operation of the Verilog simulation tools available to designers of very large scale integrated (VLSI) circuits, such as complex ASICs. Verilog is a programming language defined by Open Verilog International (OVI) Corporation and now an Institute of Electrical and Electronic Engineers (IEEE) standard (IEEE-1364). The invention is applicable to all simulators that conform to the Verilog standard. There are several such simulators on the market that run on anything from personal computers (PCS) to high-end workstations.

In a specific implementation of the invention, Verilog XL was used. Verilog XL is a licensed software program from Cadence Corporation. Verilog XL is a digital logic simulator used for simulating the behavior of a given circuit at a logical level (as opposed to transistor level, which is more accurate but much slower). It provides good simulation speed with adequate accuracy. The primitive level of simulation are simple logic gates such as AND and OR gates. There is also the ability to define primitives by the user. This differs from lower-level simulators that use transistor models as their primitive level. General information on Verilog coding and the Verilog XL simulation tool is provided in *Verilog XL Reference*, Ver. 2.2, Cadence On-line Reference library 9502, Cadence Corporation. While the invention is described in terms of the Verilog XL simulation tool, it will be understood that the invention is independent of any specific simulator, provided the simulator is a Verilog-type simulator.

The invention makes use of the Programming Language Interface (PLI) for the Verilog simulation tools. PLI is a standard way of extending the functionality of the Verilog XL tool. It allows one to write code to perform a function (which can include accessing certain data structures within the Verilog XL environment) and access one's code through a command entered inside the Verilog XL tool while simulating. The code can then perform any arbitrary function the programmer writes. Verilog and PLI coding specifications are owned and controlled by Open Verilog International (OVI) Corporation. PLI coding specifications and guidelines are provided in *PLI Reference Manual*, June 1994, OVI Corporation.

User Defined Primitives (UDPs) are a way for a Verilog simulation model developer to define additional functionality for use as primitive building blocks. These primitives are described as truth tables to the simulator. Currently in Verilog, there are no primitives that allow one to describe sequential (memory) elements, so the use of UDPs is a necessity when sequential behavior at the gate level is desired. However, a disadvantage of UDPs (and all primitives for that matter) is that they cannot be accessed uniquely in the simulation environment, meaning that if you had to retrieve or store a value in one, you could not do so using the standard functions available to you as a user of Verilog XL, for example.

Using the Verilog XL simulation tool, long simulation turn-around-times (TATs) usually exist when executing a Verilog based simulation on a high sequential device count ASIC logic design. This chip simulation "waiting time" primarily involves compilation of all Verilog models (e.g., for a sample ASIC chip, within the Cadence Schematic entry process, there are more than eight hundred Verilog files to be compiled), and chip level verification requires scan initialization for most of a design's sequential logic. For large chips, this process requires serial mode scanning of these devices for gate counts of 20,000 to 100,000 elements, such as master/slave flip-flops (or L1/L2 pairs), or a complex series of initialization patterns for non-scan based designs.

Currently, long simulation compilation and initialization times exist for large chips with high sequential device gate counts. Pre-assignment is desired as an alternative to long "wait" times to improve productivity of the designer during the verification process. There is currently no method which provides an extraction method to take a "snapshot" of a complete state of the design under test and use this as an input to initialize another simulation scenario, nor does the designer have an easy option to "pre-assign" all sequential states for high-gate-count designs.

SUMMARY OF THE INVENTION

It is therefore an object of the present invention to provide a verilog simulation method which significantly reduces scenario execution time of very large scale integrated (VLSI) logic models that contain high numbers of sequential devices.

According to the invention, a computer implemented method saves the state of sequential devices into a file at a chosen point in a simulation scenario and then inputs this file to initialize another simulation scenario. The aspect of the solution according to the invention which is unique is the ability to utilize the user defined primitive (UDP) model data for the sequential devices present in the technology library. However, using the standard data structure available in the programming language interface (PLI), it is not possible to uniquely identify individual UDPs. UDPs have the characteristic of having only one output each. Therefore, it is possible to uniquely identify each UDP by the net name which is connected to this output. An exception to this is the situation where two or more like-named UDP outputs are connected to the same net. This is not considered a problem to this implementation, since the simulation execution will resolve the nets to one value (no checking is required).

Advantages of the invention include a reduced TAT for large simulation models in the Verilog environment and increased flexibility and control for the logic designer in complex simulation scenarios. The reduced TAT is due to the portability of simulation states to different simulation scenarios. Another advantage is the ability to initialize non-scan sequential devices with this method. This portability is, however, limited to Verilog-based simulation environments.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
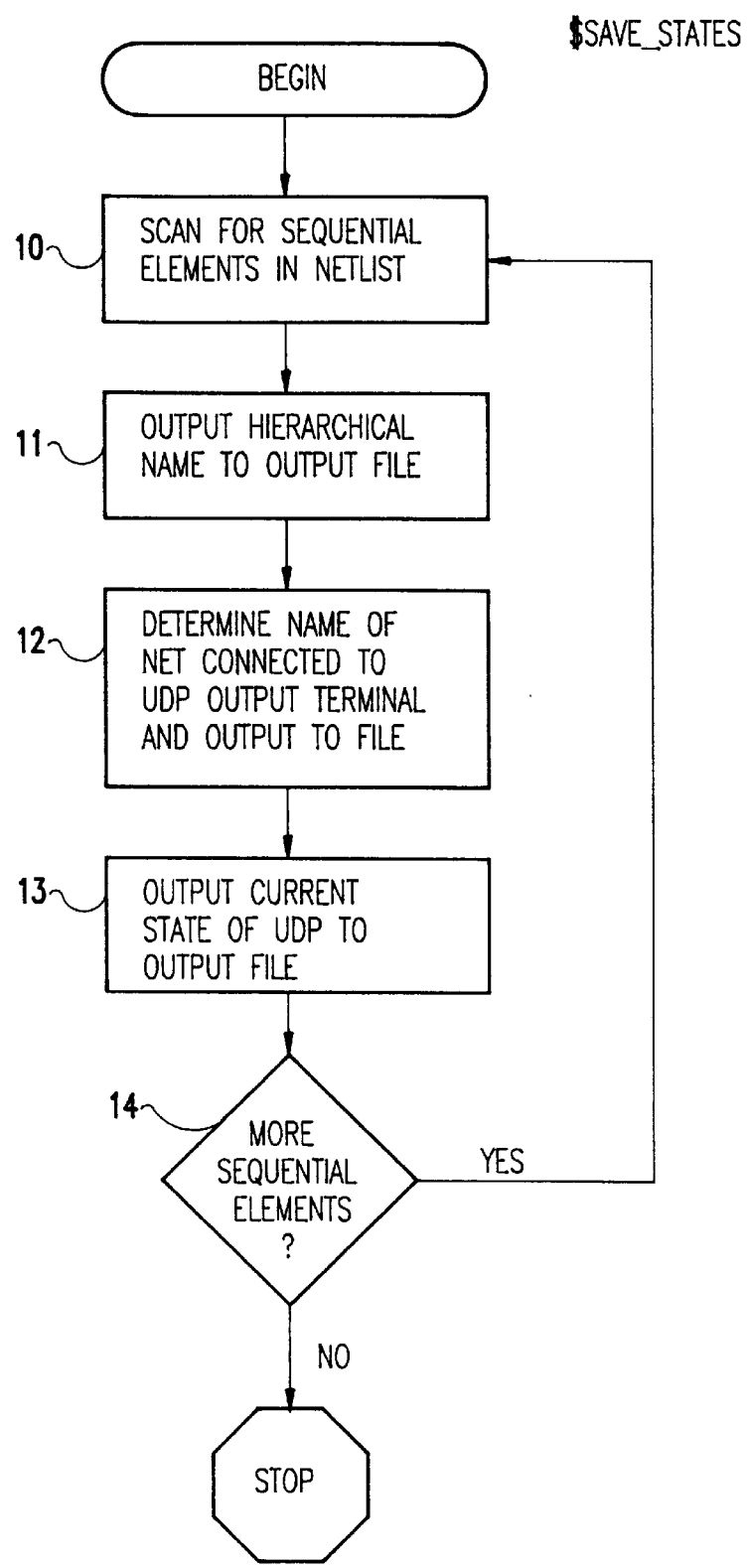
FIG. 1 is a flow diagram showing the logic of the $save_states operation according to the invention.

Referring now to the drawings, and more particularly to FIG. 1, there is shown the $save_states operation in which the specified file "yourfile" is written with state data. The process begins at function block 10 by scanning for sequential elements in a netlist. This scan results in an output of the hierarchical name of each sequential element identified to an output file in function block 11. The Verilog data structure is then examined in function block 12 to determine the name of the net connected to the UDP output terminal. The name of the net is then appended to the output file at the end of the hierarchical name written in block 11. Then the current state of the UDP is sent to the output file in function block 13. A test is next made in decision block 14 to determine if there are more sequential elements. If so, the process loops back to function block 10 to process the remaining sequential elements. When all elements have been processed, the process stops.

Figure 2:
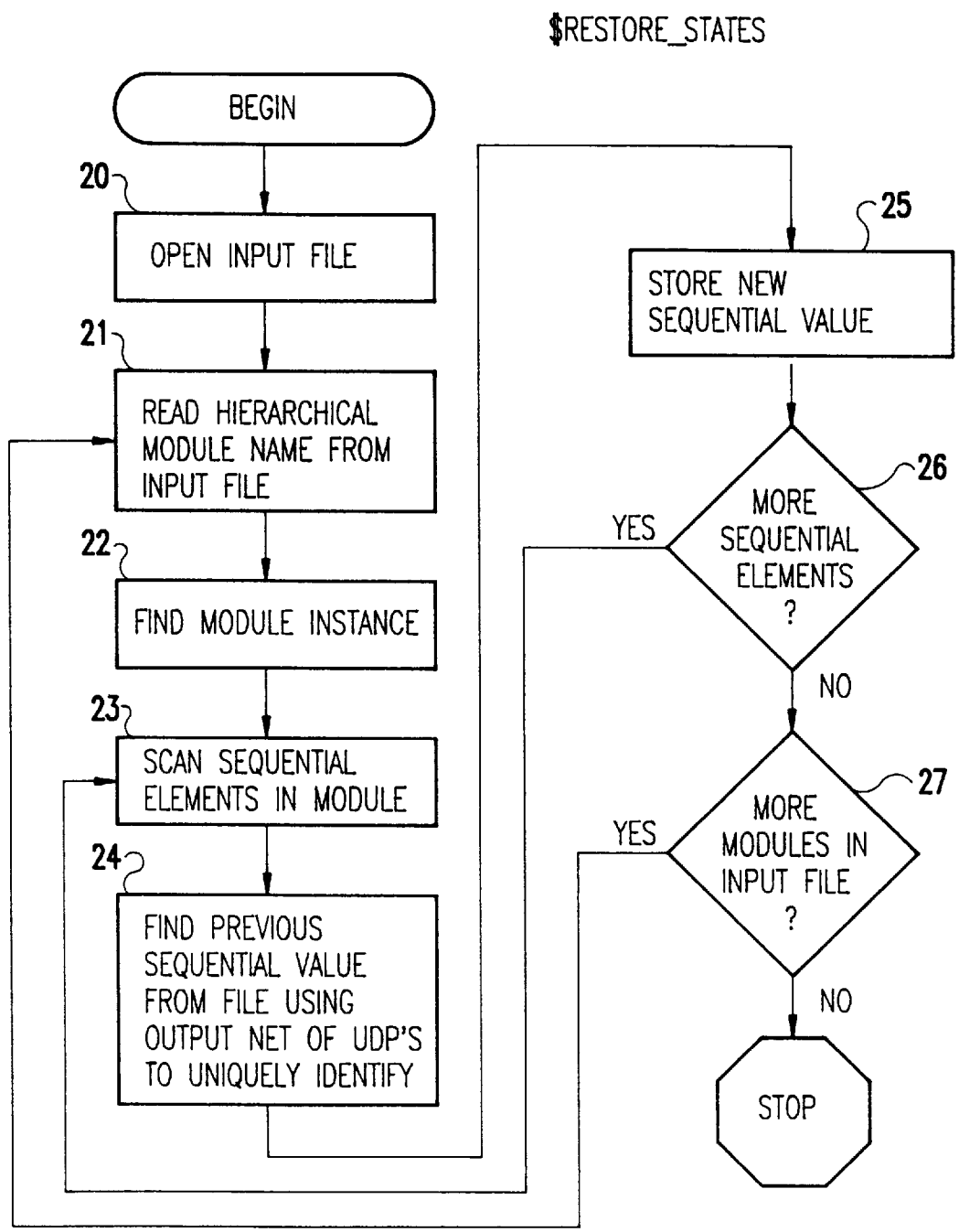
FIG. 2 is a flow diagram showing the logic of the $restore_states operation according to the invention.

FIG. 2 shows the $restore_states operation. This process begins by opening an input file in function block 20. The next hierarchical module name is read from the input file in function block 21, and the module instance is found in function block 22. The hierarchical module name read from the input file in block 21 identifies the specific module that the sequential element is to be found in. However, there may be several sequential elements in each module. Therefore, it is necessary to scan the current module in search of all sequential elements contained within it to find the exact one which the current record of the input file is describing, which occurs in function block 23.

The output net of the UDP is read from the input file and used to uniquely identify the UDP in function block 24. The target UDP is uniquely identified using the output net name of the UDP. Once the UDP is identified, the previously stored value of the UDP is read from the input file. The previously stored sequential state is stored in function block 25, and then a test is made in decision block 26 to determine if there are more sequential elements within the current module. If so, the process loops back to function block 23 to process those elements. If not, then a further test is made in decision block 27 to determine if there are more modules in the input file. If so, the process loops back to function block 21 to process the remaining modules. When all modules have been processed, the process stops.

The following is a specific example of UDP usage:

```
module L2STAR (P30,PA0,PB0,PC1,PC2,PD1,PD2,PI0);
    output P30;
    input PA0;
    input PB0;
    input PC1;
    input PC2;
    input PD1;
    input PD2;
    input PI0;
    wire I1out,I2out;
    PH2P (I1out,PA0,PC1,PI0,PD1);
    PH2P (I2out,PB0,PC2,I1out,PD2);
    BUFX i0 (P30,I2out);
endmodule
```

Notice that in this example, the two instances of 'PH2P', which are UDPs, are indistinguishable since they do not have an instance name, as does the 'BUFX'instance, which is identified as 'i0'. When referencing a UDP, the instance name is optional. Therefore, another method of uniquely identifying the two UDPs must be implemented. The solution is to use the name of the output net as a unique identifier. In this example, the output net name for the first UDP is '|1out' whereas the output net name for the second instance is '|2out'. In cases where the output net name is identical for multiple instances, distinguishing between the multiple instances is not important since the output of the individual UDPs will end up being resolved into the same output net value anyway.

For a complementary metal oxide semiconductor (CMOS) gate level design with approximately 28K master/slave flip-flops, in a Verilog XL(2.0.5) environment, an experiment was run to compare central processor unit (CPU) times for the solution provided by this invention. The results are set out in Table 1 below:

TABLE 1

| CPU Measure | Current VerilogXL (sec) | Invention using VerilogXL (sec) |
| --- | --- | --- |
| Compilation | 21.8 | 32.7 |
| Link | 86.2 | 86.6 |
| Simulation | 1805.9 | 49.8 |

The invention is applicable to scanned and non-scannable sequential devices. This is an advantage over the current way of initializing circuits, which is to scan them or perform a complex series of initialization patterns. States optionally may be changed or pre-assigned. Basically, what happens is that once states are saved using $save_states, you can either just read them back in, modify the file created by $save_states, in which case you are reading changed states, or pre-assign them, which realistically is no different than changing the states, except that one could skip the $save_states routine and simply create a file by hand, in which case you would be restoring pre-assigned states.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A computer implemented method for saving turn-around-time in simulation of complex very large scale integrated (VLSI) circuit designs and quickly initializing sequential elements in Verilog simulation without the use of a scanning function of scannable sequential elements or complex initialization sequences, comprising steps of:

running a Verilog simulation tool for a VLSI circuit design for a first simulation scenario;

saving simulation states of sequential devices in said VLSI circuit design for said first simulation scenario;

restoring the saved simulation states to the sequential devices for a second simulation scenario; and running the Verilog simulation tool for the VLSI circuit design for the second simulation scenario using the saved and restored simulation states from the first simulation scenario.

2. A computer implemented method according to claim 1, further comprising the step of changing at least one of the saved states for sequential devices in said VLSI circuit design, and wherein said step of running the Verilog simulation tool for the VLSI circuit design for the second scenario uses the saved and the changed simulation states from the first simulation scenario.

3. The computer implemented method recited in claim 1 further comprising the step of uniquely identifying user defined primitives (UDPs) for the purpose of retrieving and storing current states of UDPs, said step of uniquely identifying being performed using the output net name of the UDP to uniquely identify it.

4. A computer implemented method according to claim 1, further comprising the step of preassigning at least one of the states for sequential devices in said VLSI circuit design, and wherein said step of running the Verilog simulation tool for the VLSI circuit design for the second scenario uses the saved and the preassigned simulation states from the first simulation scenario.

* * * * *